United States Patent [19]

Varnell

[11] Patent Number: 5,217,847
[45] Date of Patent: Jun. 8, 1993

[54] LIQUID SOLDER MASK COMPOSITION

[75] Inventor: Daniel F. Varnell, Wilmington, Del.

[73] Assignee: Hercules Incorporated, Wilmington, Del.

[21] Appl. No.: 749,488

[22] Filed: Aug. 15, 1991

Related U.S. Application Data

[63] Continuation of Ser. No. 426,255, Oct. 25, 1989, abandoned.

[51] Int. Cl.$^5$ .................. G03C 1/72; G03F 7/028; G03F 7/033
[52] U.S. Cl. .................. 430/288; 430/271; 430/277; 430/281; 430/325; 430/910
[58] Field of Search .............. 430/281, 288, 285, 284, 430/909, 325

[56] References Cited

U.S. PATENT DOCUMENTS

| | | | |
|---|---|---|---|
| 4,239,849 | 12/1980 | Lipson et al. | 430/281 |
| 4,264,708 | 4/1981 | Chambers et al. | 430/288 |
| 4,504,573 | 3/1985 | Ishikawa et al. | 430/288 |
| 4,544,625 | 10/1985 | Ishimaru et al. | 430/284 |
| 4,629,680 | 12/1986 | Iwasaki et al. | 430/288 |
| 4,666,821 | 5/1987 | Hein et al. | 430/311 |
| 4,741,987 | 5/1988 | Tohda et al. | 430/288 |
| 4,761,363 | 8/1988 | Hung et al. | 430/284 |
| 4,789,620 | 12/1988 | Sasaki et al. | 430/288 |
| 4,845,011 | 7/1989 | Wilczak et al. | 430/288 |
| 5,061,602 | 10/1991 | Koch et al. | 430/288 |

FOREIGN PATENT DOCUMENTS

| | | |
|---|---|---|
| 1148015 | 6/1983 | Canada .................. 430/288 |
| 0073444 | 8/1982 | European Pat. Off. .......... 430/288 |
| 128014 | 12/1984 | European Pat. Off. . |
| 233623 | 8/1987 | European Pat. Off. . |
| 2598812 | 3/1988 | European Pat. Off. . |
| 283990 | 9/1988 | European Pat. Off. . |

Primary Examiner—Charles L. Bowers, Jr.
Assistant Examiner—John S. Chu
Attorney, Agent, or Firm—Joanne W. Patterson

[57] ABSTRACT

Disclosed is a UV-curable, aqueous developable liquid solder mask composition comprising (1) 40%–70% of a nonreactive binder that is a film-forming random copolymer of (a) one or more (meth)acrylic alkyl ester monomers, at least one of which is an ester of a 4–12 carbon alkanol, (b) acrylic or methacrylic acid, and optionally (c) styrene or α-methylstyrene, (2) 20%–40% of one or more (meth)acrylic ester monomers containing two or more ethylenic double bonds, wherein at least one of the monomers has at least four ethylenic double bonds, (3) 1%–5% of a free radical-generating photoinitiator, (4) 5%–15% of a filler, all percentages being by weight based on the nonsolvent components of the composition, and (5) an organic solvent.

10 Claims, No Drawings

LIQUID SOLDER MASK COMPOSITION

This application is a continuation of application Ser. No. 07/426,255 filed Oct. 25, 1989, now abandoned.

FIELD OF THE INVENTION

This invention relates to solder masks used in the manufacture of printed circuit boards. More particularly, it relates to liquid, UV-curable solder mask compositions that are developable in an aqueous alkaline medium and do not contain thermally activated cross-linking agents.

BACKGROUND OF THE INVENTION

Solder masks provide protection to the circuitry on printed circuit boards during processing, as well as providing continued protection throughout the life of the circuit board. These masks must be resistant to solder compositions as well as etching fluids such as methylene chloride, and also withstand environmental stresses such as changes in temperature and humidity. At the same time they must remain flexible enough to withstand mechanical stresses without cracking or peeling. The Institute of Interconnecting and Packaging Electronic Circuitry (IPC) describes requirements for solder mask coatings in their SM840-B specifications. The specifications include, among other things, hydrolytic stability, electrical resistivity, thermal stability, abrasion resistance, solvent resistance, and limited flammability. The requirements for a Class III material are the most severe, since these materials are used for life support systems and military equipment.

The solder mask composition is applied to a circuit board and partially cured in the desired areas by exposure to ultraviolet radiation through a phototool or negative. After the unexposed composition is removed from the board by washing with an aqueous solution or an organic solvent, the partially cured mask is fully cured by further exposure to ultraviolet radiation or a combination of irradiation and thermal curing.

Aqueous developable liquid solder mask compositions have been described, for example, in U.S. Pat. Nos. 4,666,821, 4,761,363 and 4,789,620. Compositions such as these do not contain solvents and therefore remain in the liquid state until cured. They require special process equipment and special processing steps such as off-contact printing. Other liquid, aqueous developable solder mask compositions are described in U.S. Pat. Nos. 4,438,189; 4,621,043 and 4,695,527. All of these compositions, however, require thermal curing in addition to irradiation with ultraviolet light to completely cure the mask. Compositions requiring a thermal cure contain thermally activated cross-linking agents that can cause thermal instability prior to and during drying and imaging. U.S. Pat. No. 4,717,643 describes an aqueous developable, dry film solder mask that does not require a thermal cure. However, the synthesis of the binder requires the grafting of isocyanatoethyl methacrylate groups onto the acrylic backbone polymer, which is a complicated and time consuming procedure. Vacuum lamination of the film to the substrate is also required.

SUMMARY OF THE INVENTION

The liquid solder mask composition of this invention comprises (1) from about 40% to about 70% of a nonreactive binder that is a film-forming random copolymer prepared from (a) one or more acrylic or methacrylic alkyl ester monomers, at least one of which is an ester of a 4–12 carbon alkanol, (b) methacrylic or acrylic acid, and optionally (c) styrene or α-methylstyrene, (2) from about 20% to about 40% of one or more acrylic or methacrylic ester monomers containing two or more ethylenic double bonds, wherein at least one of the monomers has at least four ethylenic double bonds, (3) from 1% to about 5% of a free radical-generating photoinitiator, (4) from about 5% to about 15% of a filler, all percentages being by weight based on the nonsolvent components of the composition, and (5) from about 35% to about 70% of an organic solvent or mixture of organic solvents, based on the total weight of the composition.

The solder mask composition is cured by ultraviolet radiation after application to the substrate and drying to remove the solvent. A thermally-activated cross-linking agent is not required for curing. The unexposed portions of the composition are removed using an aqueous alkaline solution.

DETAILED DESCRIPTION OF THE INVENTION

The nonreactive film-forming polymer binder of the present invention preferably has a weight average molecular weight ($M_w$) between 50,000 and 200,000 g/mole, preferably 75,000 to 150,000, and a polydispersity (number average molecular weight/$M_w$) less than 5, preferably less than 3. In any of these binders there is preferably a minimum of variation in composition from one polymer chain to the next. The binder is a random copolymer of (a) one or more acrylic or methacrylic alkyl ester monomers, at least one of which is an ester of a 4–12 carbon alkanol, (b) methacrylic acid or acrylic acid, and optionally (c) styrene or α-methylstyrene. The weight % of methacrylic or acrylic acid is typically between 15% and 25%. By "nonreactive" binder is meant one that does not take part in a cross-linking reaction and does not react with the multi-functional monomers. The binder and monomers are believed to form a "semi-interpenetrating network" where the two components are not chemically bound to each other and where the binder does not cross-link, but the multifunctional monomer does. Typical acrylic and methacrylic ester monomers that are suitable for use in the preparation of the binder include, but are not limited to, butyl (meth)acrylate, methyl (meth)acrylate, lauryl (meth)acrylate, pentyl (meth)acrylate, and ethyl (meth)acrylate. The binder is present in the composition in an amount of from about 40 to about 70 weight % of the nonsolvent components.

Multifunctional acrylic or methacrylic ester monomers having two or more ethylenic double bonds that are suitable for use as component (2) of the composition of this invention include, but are not limited to, trimethylolpropane triacrylate, pentaerythritol triacrylate, pentaerythritol tetraacrylate, dipentaerythritol pentaacrylate, tripropylene glycol diacrylate, di-trimethylolpropane tetraacrylate, bis-phenol A diacrylate, bis-phenol A dimethacrylate, and the diacrylate or dimethacrylate of a polyethylene glycol adduct of bis-phenol A with 2 to 20 ethylene oxide units. These monomers preferably have a molecular weight of less than 1100 g/mole. The monomers are present in an amount of from about 20 to about 40 wt. % of the nonsolvent components, preferably between 25% and 35%.

Any conventional photoinitiator that is activatable by actinic radiation but that is thermally inactive at temperatures below 160° C. can be used as component (3) of the composition of this invention. Examples of useful photoinitiators are found in U.S. Pat. No. 4,268,610, which is incorporated herein by reference. Preferred photoinitiators include α,α-dimethoxyphenylacetophenone, benzophenone, 2-methyl-1-[4-(methylthio)-phenol]-2-morpholinopropanone-1 and ethyl 4-(dimethylamino)-benzoate. In addition, photosensitizers such as Michlers' ketone and isopropylthioxanthone can be added. The photoinitiator is present in an amount of from 1 to about 5 weight % of the nonsolvent components.

The composition of this invention also includes one or more organic solvents. The evaporation rate of the solvent, or mixture of solvents, should be fast enough so as not to be a hindrance to commercial use and in general falls between 1 and 0.01, where the rate of evaporation of butyl acetate is taken as equal to 1. For screen printing, the preferred range is from 0.1 to 0.01. Those skilled in the art can combine solvents to produce a film with good leveling properties, suitable "out-time" (time that it can remain on the screen before it becomes too thick to use), and a drying rate fast enough so that it is not a hindrance to commercial use. Typical compositions contain from about 35% to about 70% solvent, based on the total weight of the composition. Suitable solvents include, but are not limited to, butyl acetate, isobutyl acetate, propylene glycol monomethyl ether, ethylene glycol monobutyl ether, dimethylformamide and dipropylene glycol monomethyl ether.

A finely divided filler such as, for example, aluminum oxide, silicon dioxide, talcum, mica, or kaolin, is added to the composition in an amount of from about 5% to about 15% by weight, based on the nonsolvent components of the composition. The average particle size of the filler is generally less than 0.3 micron.

The composition can optionally include an adhesion promoter such as the 4-methyl and 5-methyl isomers of tolutriazole-formaldehyde-diethanolamine. If an adhesion promoter is used, it is present in an amount of 0.05 to 0.30%, based on the weight of the nonsolvent components. Other additives well known in the art such as antioxidants and pigments can also be present.

The solder mask compositions of this invention are coated from solution onto a clean printed wiring board on which circuit patterns have been formed. The coating is typically applied by screen coating, but roll coating, dip coating and curtain coating can also be used. The coating is then dried to remove the solvent at temperatures from ambient to about 150° C., typically at about 75° to 100° C. Application as a liquid and subsequent drying provides the advantages of easy handling of the coated circuit board, control of film thickness and elimination of the need for vacuum lamination, which is required when using dry film solder masks. The board does not have to be held in a horizontal position during coating and coatings can be applied to one or both sides. Unlike many prior art processes, the drying time is not critical, since the compositions of this invention are thermally stable and the desired properties do not deteriorate even when the drying is continued 10 to 20 times longer than customary. Following drying, the masks are photoimaged by ultraviolet actinic radiation to produce a pattern of cured and uncured areas. The uncured material is washed away (the developing step) by an aqueous alkaline solution, typically 0.75–1.5% $Na_2CO_3$ at 29°–46° C. The solder mask is post-cured with ultraviolet light (typically 3 to 5 $J/cm^2$) and heated, typically for 1 to 1.5 hours at 150°–170° C. The circuit board is then ready for the application of solder and circuitry by methods well known to those skilled in the art. The cured solder mask compositions of this invention pass Class I, Class II and Class III requirements as described by the Institute of Interconnecting and Packaging Electronic Circuitry (IPC) in their SM840-B specification.

EXAMPLE 1

A solution of the ingredients listed in Table 1 is prepared by dispersing the silicon dioxide and phthalocyanine green pigment in a 50% solution of polymeric binder and ethylene glycol monomethyl ether using a high shear mixer. The remaining ingredients are added and the mixture is stirred for 1.5 hours to obtain a uniform solution. Films are formed on a copper clad epoxy-fiberglass laminate by screen coating with a 40 mesh screen. Films are also formed on copper and tin/lead wiring boards with an IPC B25 test pattern.

The coatings are dried by baking in a vented oven at 100° C. for 20 minutes. Testing for residual solvents showed less than 0.01% ethylene glycol monomethyl ether remaining in the films. The residual solvent tests are run on a gel permeation chromatograph. The coatings are then imaged through diazo film with ultraviolet light from a medium pressure mercury vapor arc lamp. The unexposed and thus uncured portions are developed away in a dilute alkaline solution (0.75% $Na_2CO_3$) at 29° C. with 20 psi spray pressure, rinsed with water and dried. The samples are then blanket exposed with 6 $J/cm^2$ of UV light and heated for one hour at 150° C.

The samples are subjected to IPC tests for solder mask materials and are found to meet IPC Class III requirements. The samples are stable during immersion for 10 seconds in molten solder at 260° C.

TABLE 1

| Component | Parts |
|---|---|
| 1. 50% solution of acrylic polymer* in ethylene glycol monomethyl ether | 120.0 |
| 2. Precipitated silica | 10.0 |
| 3. Ethylene glycol monomethyl ether | 20.0 |
| 4. Ethylene glycol monobutyl ether | 20.0 |
| 5. Trimethylolpropane triacrylate | 1.60 |
| 6. Pentaerythritol tetraacrylate | 15.0 |
| 7. Depentaerythritol pentaacrylate | 4.0 |
| 8. Dimethylacrylate adduct of an ethoxylated bisphenol A (Mw = approximately 800) | 4.0 |
| 9. α,α-Dimethoxyphenylacetophenone | 5.0 |
| 10. Phthalocyanine green pigment | 0.40 |

*A random copolymer of methacrylic acid (22%), methyl methacrylate (20%), lauryl methacrylate (25%) and ethyl acrylate (33%).

EXAMPLE 2

Samples A, B, C and D are prepared as described in Example 1, using the components listed in Table 2, with the exception that various drying times and temperatures are used for the final heat treatment. These temperatures and times are listed in Table 3.

TABLE 2

| Component | Parts |
|---|---|
| 1. 50% solution of acrylic polymer* in ethylene glycol monobutyl ether | 125.0 |
| 2. Aluminum oxide | 4.0 |
| 3. Fumed silica | 4.0 |
| 4. Ethylene glycol monobutyl ether | 27.5 |

TABLE 2-continued

| Component | Parts |
| --- | --- |
| 5. Dipropylene glycol monomethyl ether | 10.0 |
| 6. Dipentaerythritol pentaacrylate | 25.0 |
| 7. Propoxyglycerol triacrylate | 8.0 |
| 8. α,α-Dimethoxyphenylacetophenone | 5.0 |
| 9. Phthalocyanine green pigment | 0.40 |
| 10. Tolutriazole-formaldehyde-diethanol amine (4-methyl and 5-methyl isomers) | 0.20 |
| 11. Trimethylolpropane triacrylate | 1.60 |

*Random copolymer of 60% butyl acrylate, 20% methyl methacrylate, 20% methacrylic acid.

TABLE 3

| Sample | Drying Temperature | Drying Time |
| --- | --- | --- |
| A | 100° C. | 15 min. |
| B | 70° C. | 20 min. |
| C | 100° C. | 60 min. |
| D | 150° C. | 30 min. |

What I claim and desire to protect by Letters Patent is:

1. A liquid composition consisting essentially of an aqueous developable mixture of
   (1) from about 40% to about 70% of a nonreactive binder that is a film-forming random copolymer prepared from (a) one or more acrylic or methacrylic alkyl ester monomers, at least one of which is an ester of a 4–12 carbon alkanol, and (b) methacrylic or acrylic acid,
   (2) from about 20% to about 40% of ethylenically unsaturated monomers consisting essentially of one or more acrylic or methacrylic ester monomers containing at least four ethylenic double bonds or a mixture thereof with one or more acrylic or methacrylic monomers containing at least two ethylenic double bonds,
   (3) from 1% to about 5% of a free radical-generating photoinitiator,
   (4) from about 5% to about 15% of a filler, all percentages being by weight based on the nonsolvent components of the composition, and
   (5) from about 35% to about 70% of an organic solvent or mixture of organic solvents, based on the total weight of the composition, said composition being capable of forming a solder mask meeting Class III (IPC) requirements.

2. The composition of claim 1 wherein component (1) is a random copolymer of butyl acrylate, methyl methacrylate and methacrylic acid.

3. The composition of claim 1 wherein the monomer having at least four ethylenic double bonds is pentaerythritol tetraacrylate or dipentaerythritol pentaacrylate.

4. The composition of claim 1 which additionally comprises an adhesion promoter.

5. A circuit board having attached thereto the solder mask composition of claim 1.

6. A solder mask meeting Class III (IPC) requirements formed by curing the composition of claim 1.

7. The composition of claim 1 wherein said binder is prepared from an additional component (c), styrene or alpha-methylstyrene.

8. The composition of claim 7 which additionally comprises an adhesion promoter.

9. A circuit board having attached thereto the solder mask composition of claim 7.

10. A solder mask meeting Class III (IPC) requirements formed by curing the composition of claim 7.

* * * * *